United States Patent
Cremer et al.

(10) Patent No.: US 7,916,449 B2
(45) Date of Patent: Mar. 29, 2011

(54) CREATION OF CAPACITORS EQUIPPED WITH MEANS TO REDUCE THE STRESSES IN THE METAL MATERIAL OF THEIR LOWER STRUCTURES

(75) Inventors: Sébastien Cremer, Sassenage (FR); Philippe Delpech, Meylan (FR); Sylvie Bruyere, Le Champ Pres Froges (FR)

(73) Assignee: STMicroelectronics SA, Montrouge (FR)

( * ) Notice: Subject to any disclaimer, the term of this patent is extended or adjusted under 35 U.S.C. 154(b) by 406 days.

(21) Appl. No.: 12/134,490

(22) Filed: Jun. 6, 2008

(65) Prior Publication Data
US 2009/0040684 A1 Feb. 12, 2009

(30) Foreign Application Priority Data
Jun. 7, 2007 (FR) ...................... 07 55553

(51) Int. Cl.
H01G 4/06 (2006.01)
(52) U.S. Cl. ..................... 361/311; 361/301.4; 361/312; 361/313; 361/321.1; 361/321.2
(58) Field of Classification Search .................. 361/311, 361/312–313, 321.1, 321.2, 306.1, 306.3, 361/301.4, 328–330
See application file for complete search history.

(56) References Cited

U.S. PATENT DOCUMENTS

| | | | |
|---|---|---|---|
| 6,251,740 B1 | 6/2001 | Johnson et al. | 438/381 |
| 6,441,419 B1 | 8/2002 | Johnson et al. | 257/296 |
| 6,459,562 B1 * | 10/2002 | KarRoy et al. | 361/312 |
| 6,765,255 B2 * | 7/2004 | Jin et al. | 257/301 |
| 6,876,027 B2 * | 4/2005 | Lien et al. | 257/306 |
| 7,253,075 B2 * | 8/2007 | Hieda | 438/393 |
| 7,508,648 B2 * | 3/2009 | Ahn et al. | 361/311 |
| 7,508,649 B2 * | 3/2009 | Kwon et al. | 361/311 |
| 7,596,842 B2 * | 10/2009 | Andresakis et al. | 29/25.42 |
| 7,741,188 B2 * | 6/2010 | Dyer et al. | 438/386 |
| 2001/0020713 A1 | 9/2001 | Yoshitomi et al. | 257/306 |
| 2002/0163029 A1 | 11/2002 | Dirnecker et al. | 257/306 |
| 2003/0183862 A1 | 10/2003 | Jin et al. | 257/301 |
| 2004/0232557 A1 | 11/2004 | Kim | 257/758 |
| 2006/0076596 A1 | 4/2006 | Ohkubo et al. | 257/296 |
| 2006/0234464 A1 | 10/2006 | Giraudin et al. | 438/386 |

FOREIGN PATENT DOCUMENTS

| | | |
|---|---|---|
| FR | 2884646 | 10/2006 |
| GB | 2390223 | 12/2003 |

OTHER PUBLICATIONS

"Single Mask Metal-Insulator-Metal (MIM) Capacitor with Copper Damascene Metallization for Sub-0.18μm Mixed Mode Signal and System-on-a-Chip (SoC) Applications", Liu et al., Proceedings of the IEEE 2000 International Interconnect Technology Conference (CAT. No. 00EX407), IEEE Piscataway, NJ, USA, 2000, pp. 111-113, XP002460408, ISBN: 0-7803-6327-2.

* cited by examiner

*Primary Examiner* — Nguyen T Ha
(74) *Attorney, Agent, or Firm* — Lisa K. Jorgenson; Allen, Dyer, Doppelt, Milbrath & Gilchrist, P.A.

(57) ABSTRACT

The method for forming the microelectronic device having at least one two or three dimensional capacitor includes creating, on a substrate, a plurality of components and a number of superimposed metal interconnection levels. An insulating layer is formed above a metal interconnection level, and a horizontal metal zone of a next metal interconnection level in which one or more of the insulating blocks created from this insulating layer are incorporated is formed therein. The zone is designed to form a lower structural part of the capacitor.

20 Claims, 11 Drawing Sheets

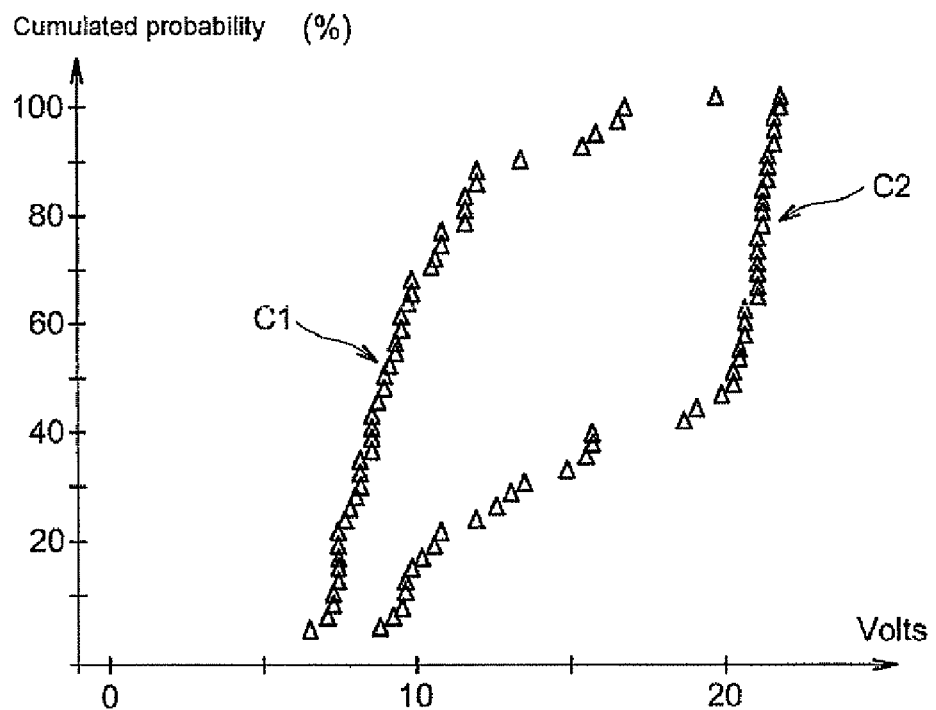
FIG. 2
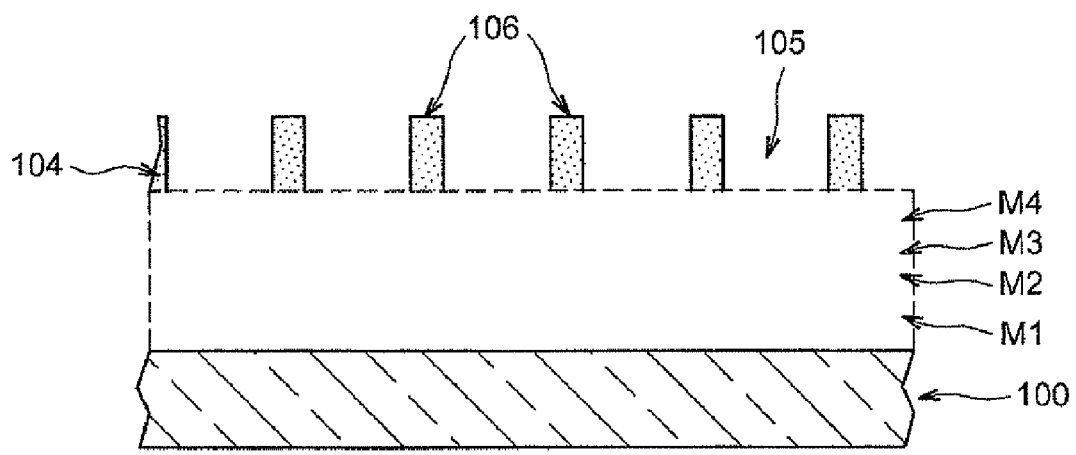
FIG. 3A
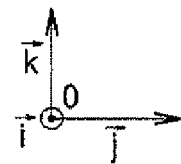

US 7,916,449 B2

CREATION OF CAPACITORS EQUIPPED WITH MEANS TO REDUCE THE STRESSES IN THE METAL MATERIAL OF THEIR LOWER STRUCTURES

FIELD OF THE INVENTION

The invention relates to the field of microelectronics and in particular to Metal-Insulator-Metal (MIM) capacitors in integrated circuits. More specifically, the invention deals with the fabrication of integrated circuits equipped with at least one capacitor, in which a lower structure of the capacitor, formed from at least one metal material, includes a feature to reduce the stresses generated by this material. In particular, the invention allows the integrated circuit's creation with three-dimensional MIM capacitors in which the number of manufacturing faults is reduced, and results in more efficient production of such circuits. The invention also contributes to improved electrical performance of capacitors, such as three-dimensional MIM capacitors, especially in terms of breakdown voltage.

BACKGROUND OF THE INVENTION

It is desired to integrate increasing numbers of high-performance capacitors, in terms of linearity and leakage current, into microelectronic devices such as RF circuits or "systems on a chip" (SoC). It is also desired to optimize the capacitance per unit area of these devices. To satisfy these requirements, three-dimensional capacitors have appeared. These capacitors are equipped with "horizontal" armature or electrode parts, meaning that they are parallel to the principal plane of a substrate, and "vertical" armature or electrode parts, meaning that they are making a nonzero angle with the principal plane of the substrate or are orthogonal to the principal plane of the substrate. These capacitors are generally formed by at least one step of a method of the Damascene type, by the filling of slots with an MIM stack including a thin metal layer, a thin insulating layer and another thin metal layer.

In FIG. 1, a microelectronic device equipped with at least one three-dimensional metal-insulation-metal (MIM) capacitor, known as a "3D MIM" is illustrated. This device is equipped with at least one three-dimensional capacitor arranged to satisfy the requirements of small size and large capacitance simultaneously. The device is formed from a substrate 1 on which, for example, a plurality of components and of superimposed metal interconnection levels, such as 6 metal interconnection levels M1, M2, M3, M4, M5, M6, have been created (the components and the first four metal interconnection levels M1, . . . , M4 being shown in FIG. 1 by a block in broken lines above the substrate 1).

In this device, the capacitor 2 is equipped with armatures formed from "vertical" metal parts created in a plane that is orthogonal to the principal plane of the substrate 1, from a first thin metal layer 3, and from a second thin metal layer 5 separated from the first thin metal layer 3 by a thin dielectric material layer 4. The thin dielectric layer 4 and the second thin metal layer 5 cover the walls and the bottom of slots created in an insulating layer 6 in which are formed metal connection elements 7, commonly called "vias", between the fifth metal level M5 and the sixth metal level M6. The armatures of the capacitor also include horizontal metal parts 8 and 9 formed in metal layers of the fifth metal level M5 and of the sixth metal level M6 respectively.

Creation of the lower structure of such a capacitor, and in particular of the horizontal metal part 8 of this capacitor in the metal layer of the fifth metal level M5 gives rise to a problem. The metal material on the basis of which the metal part 8 is created is generally copper. The copper induces stresses that have a tendency to result, during steps executed after the deposition of this metal and requiring a high thermal input, in the formation of protuberances or "hillocks" on the surface of this copper metal part 8.

These protuberances have a tendency to give rise to manufacturing faults in the parts of the device located above the fifth metal level, and to damage the electrical performance of the capacitor 2, in particular in terms of breakdown voltage. The faults engendered also increase as the area allocated to the metal part 8 increases.

In FIG. 2, the curves C1 and C2 are examples of breakdown voltage curves, respectively when the metal part 8 of the lower structure of the capacitor 2 has an area of the order of 5,000 $\mu m^2$ for example, and when this metal part 8 has an area of the order of 50,000 $\mu m^2$ for example. The reduction in the electrical performance of the capacitor 2, in terms of breakdown voltage, increases as the area of the metal part 8 increases.

One approach used to address the breakdown voltage of the capacitor 2 is therefore to reduce the area of the metal part 8 of its lower structure, for example by giving this metal part 8, in a plane parallel to the principal plane of the substrate, a shape or a design according to the shape or the design created by the filled slots of the MIM stack located in another plane parallel to the principal plane of the substrate. As an example, in the case in which the filled slots of the MIM stack create a comb-shaped pattern, the metal part 8 can also be designed with this same comb-shaped pattern. However, such an approach results in reducing the capacitor surface capacitance Co, to the extent that a minimum space is imposed between the teeth of the comb, by the lower metal level in particular.

The problem then is to provide an integrated 3D MIM capacitor that does not have the aforementioned drawbacks.

SUMMARY OF THE INVENTION

The invention firstly relates to a method for the fabrication of an microelectronic device equipped with at least one capacitor and includes: creating on a substrate, a plurality of components and number k (where $k \geq 1$) of superimposed metal interconnection levels $(M_1, \ldots, M_4)$; and creating in an insulating layer formed above the $k^{th}$ metal interconnection level, a horizontal metal zone for a $k+1^{th}$ metal interconnection level so that one or more insulating blocks created from the insulating layer are incorporated into the metal zone, this metal zone being suitable to form a lower structure part of the capacitor. By tower structure it is meant the capacitor armature closest to the substrate.

The capacitor can advantageously be a 3D metal-insulation-metal (MIM) capacitor. The invention can also be adapted to other types of integrated capacitor, and in particular to two-dimensional capacitors.

According to one embodiment, the method can also include: forming a second insulating layer above the k+1th metal level; creating, in this second insulating layer, a plurality of slots exposing portions of the metal zone; covering the walls and the bottom of the slots with a MIM stack formed with at least one first thin metal layer, at least one thin dielectric layer on the first thin metal layer, and at least one second thin metal layer on the thin dielectric layer. After the covering step of the MIM stack, the method may include filling of the slots with at least one metal material.

According to one possible option, the creation of the metal zone can include: etching the insulating layer so as to form at least one cavity, where the insulating blocks are located in this cavity; and filling the cavity with at least one metal material. According to one embodiment, the slots can be created so as to also expose the insulating blocks. According to a further embodiment, the slots can expose only the metal zone.

The creation of the metal zone can include: etching the insulating layer so as to form a plurality of distinct parallel grooves separated from each other by insulating blocks, and filling the grooves with at least one metal material. Several of the slots can be orthogonal to the grooves. The method can also include the creation of a plurality of conducting elements in the second insulating layer, the elements being designed for connection between the (k+1)th metal interconnection level and a (k+2)th metal interconnection level.

The invention also relates to a microelectronic device including: a substrate and a plurality of superimposed metal interconnection levels on the substrate, and at least one 3D MIM capacitor, a lower structure of the capacitor being formed from at least one horizontal metal zone formed in an insulating layer belonging to a given k+1th metal level (where k is equal to or greater than 1) from among the plurality of metal levels. One or more insulating blocks created from the insulating layer are incorporated into the metal zone.

According to one possible option, the device can also include another insulating layer located above the (k+1)th metal level and including a plurality of slots exposing portions of the metal zone. The walls and the bottom of the slots are covered with a MIM stack formed from at least one first thin metal layer, at least one thin dielectric layer on the first thin metal layer, and at least one second thin metal layer on the thin dielectric layer. The slots can further be filled with a metal material in contact with the second thin metal layer.

According to another embodiment option of the device, the first thin metal layer at the bottom of the slots filled by the MIM stack, can be in contact only with the metal zone. The insulating pads are in contact with the first thin metal layer located to the bottom of the slots filled by the MIM stack. According to a variant, the metal zone can be in the form of separate parallel metal strips. Several of the slots can be orthogonal to the grooves.

BRIEF DESCRIPTION OF THE DRAWINGS

This present invention will be better understood on reading the description that follows of embodiment examples that are given by way of guidance only and in no way limiting, and with reference to the appended drawings in which:

FIG. 2 is a graph illustrating two examples of breakdown voltage curves of the capacitor of FIG. 1, for two different areas of its lower structure;

FIGS. 3A-3E, and 4A-4B are cross-sectional and top views illustrating an example of one embodiment of a 3D MIM capacitor according to the present invention;

DETAILED DESCRIPTION OF THE PREFERRED EMBODIMENTS

Identical, similar or equivalent parts in different figures bear the same numerical references so as to facilitate passage from one figure to another. The different parts represented in the figures are not necessarily to the same scale, so that the figures can be rendered easy to read.

Figure 1:
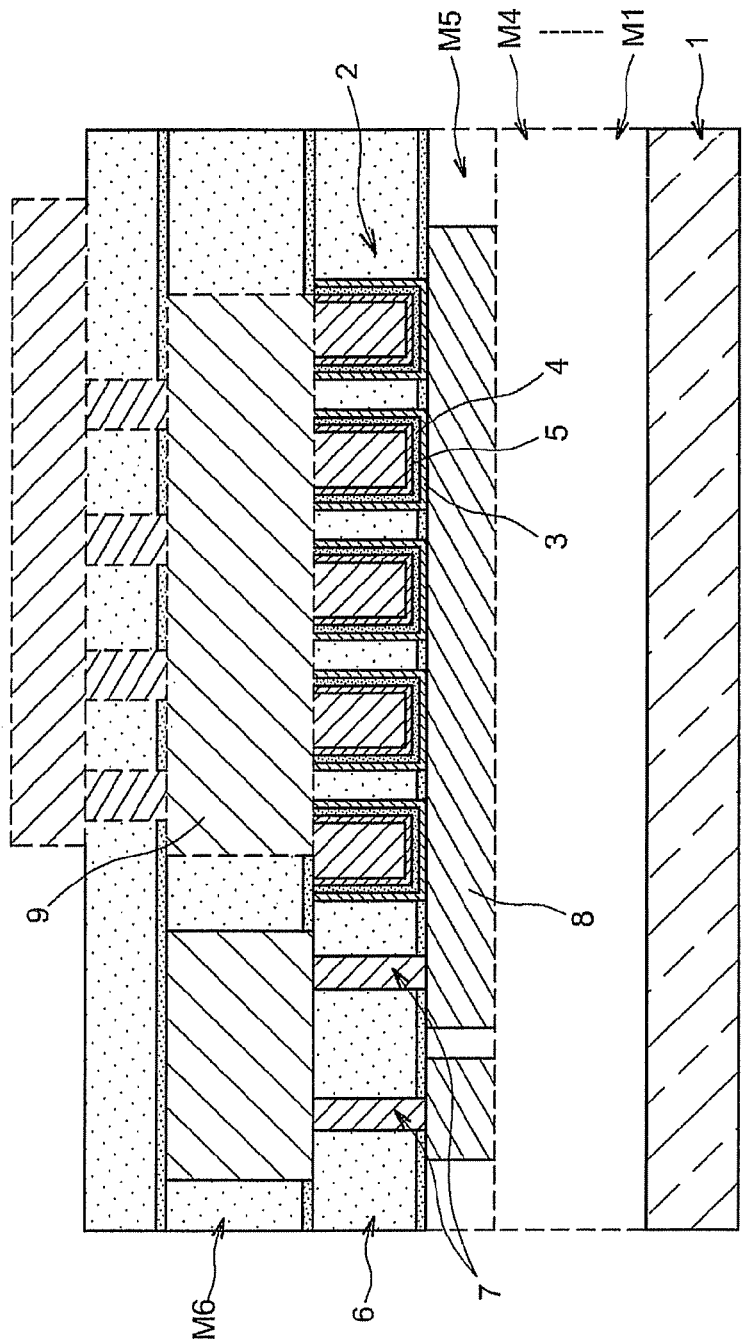
FIG. 1 is a cross-sectional view illustrating an example of a microelectronic device equipped with a 3D MIM capacitor according to the prior art.
Figure 3B:
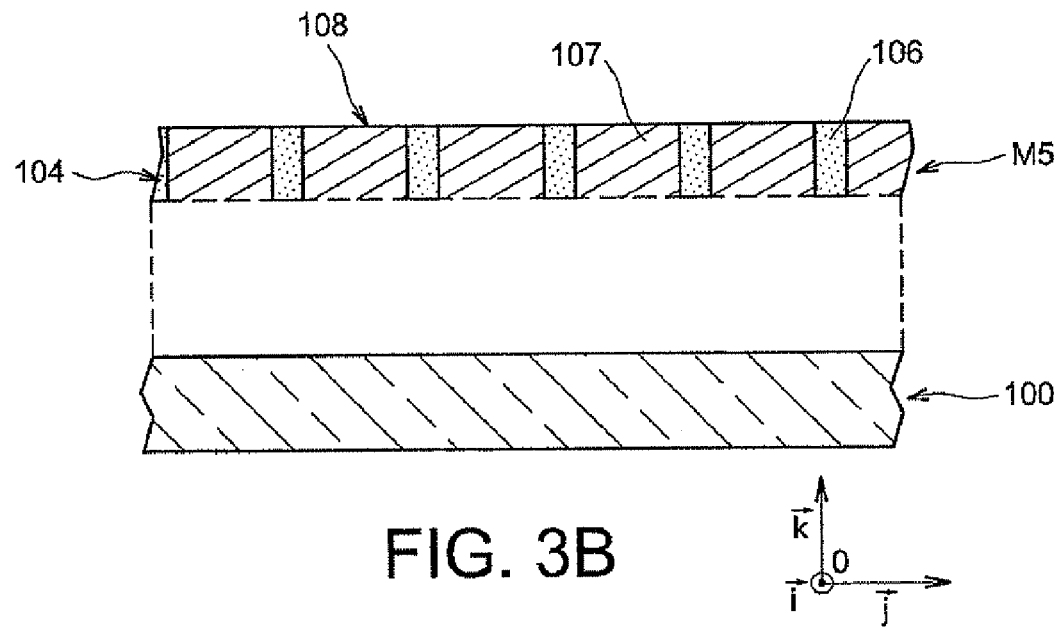
Figure 3C:
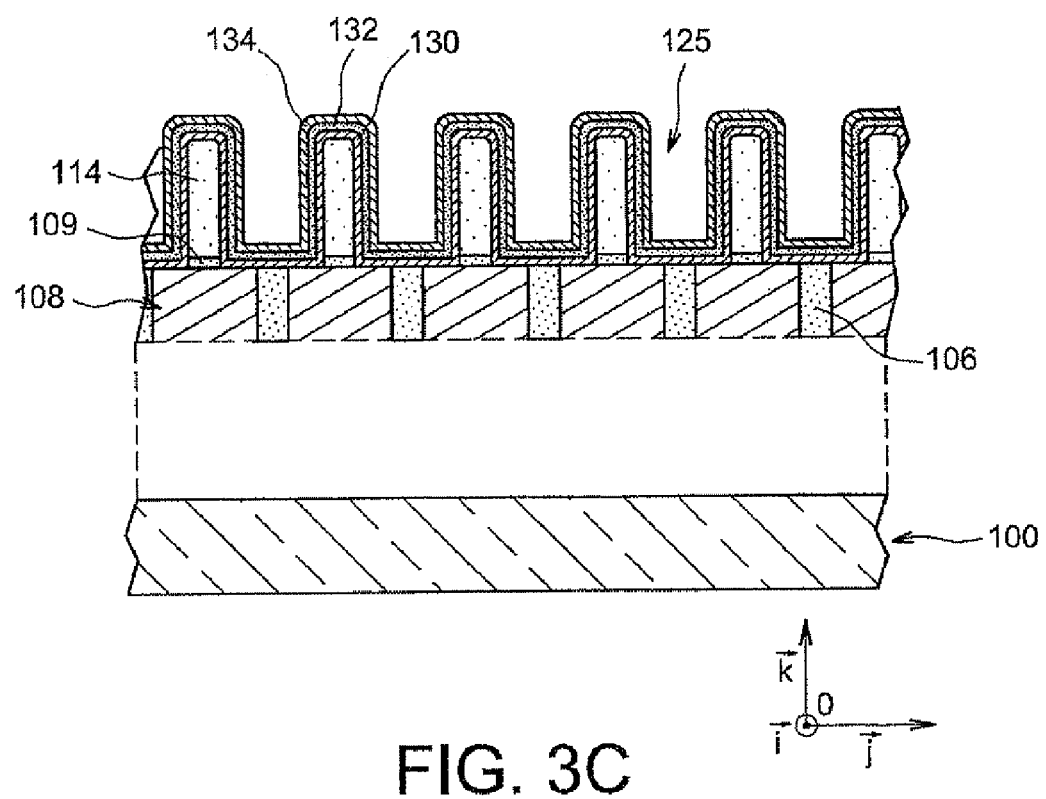
Figure 3D:
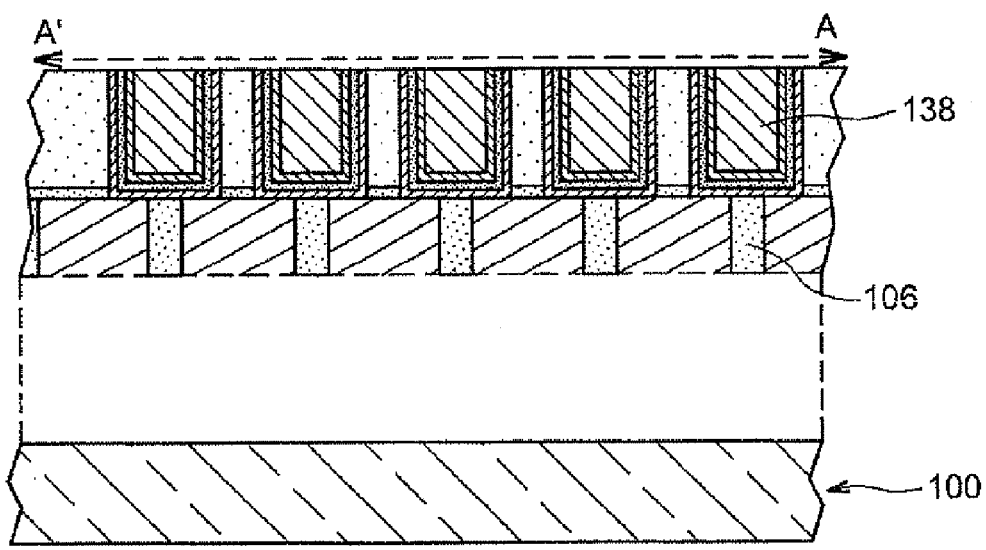
Figure 4A:
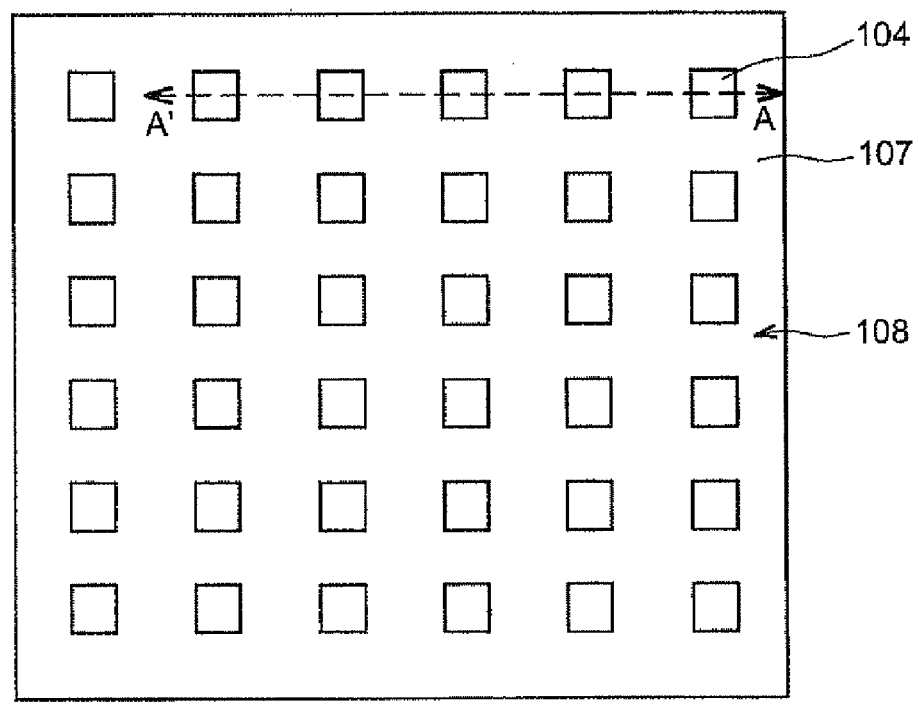
Figure 3E:
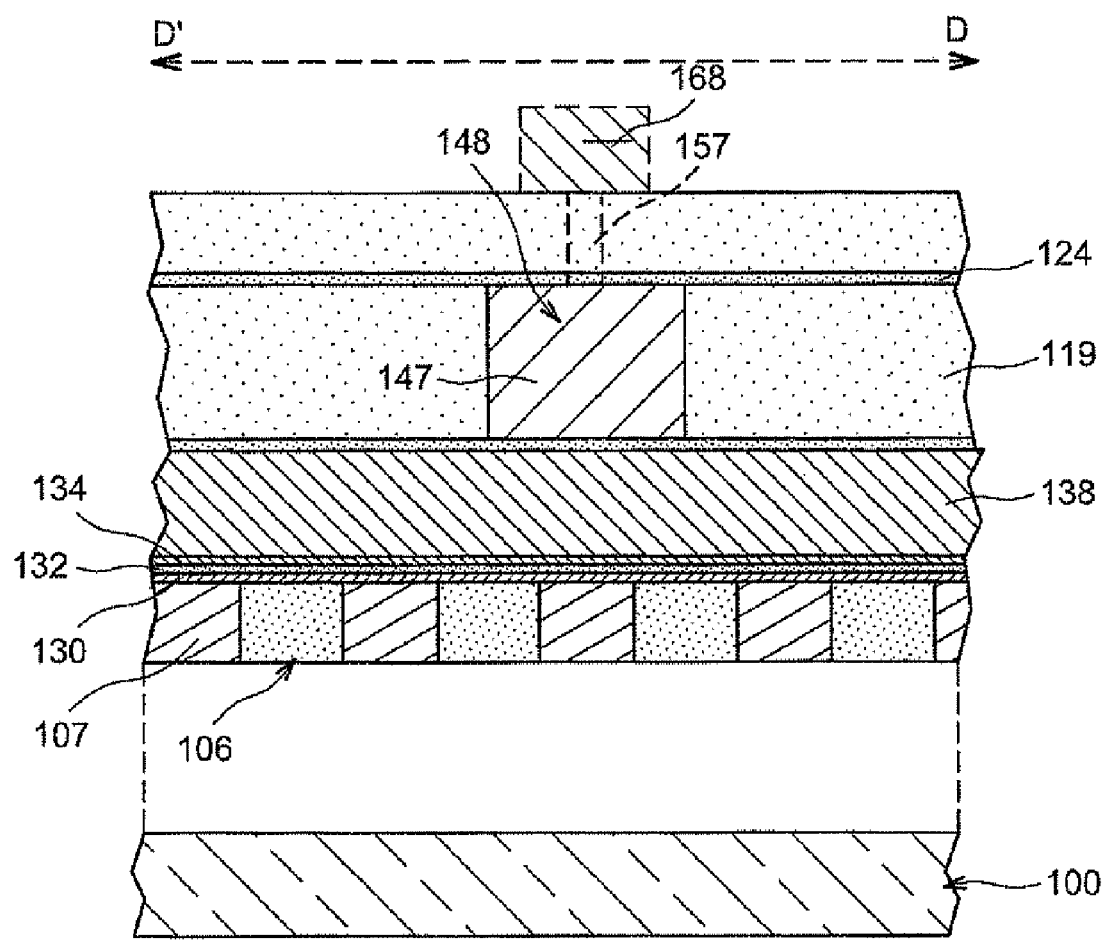
Figure 4B:
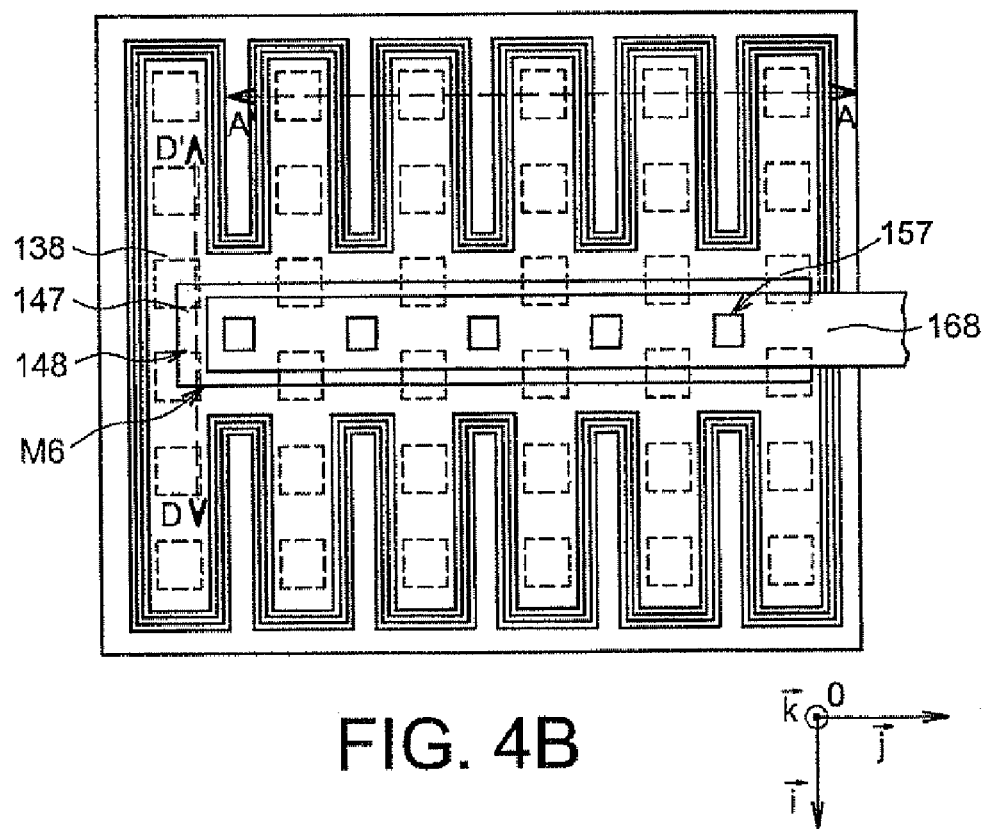

An example of an embodiment of a microelectronic device according to the invention, equipped with at least one 3D MIM capacitor, will now be described with reference firstly to FIGS. 3A-3E and secondly to FIGS. 4A-4B, representing the device in the process of creation, in a cross sectional view and a view from above respectively. The starting material of this method can be an integrated circuit in the process of creation, such as a circuit including at least one module dedicated to radio-frequency and/or analog applications for example. This circuit includes a substrate 100, on which a plurality of components have been formed and may already be equipped with a plurality of superimposed metal interconnection levels, such as four metal interconnection levels for example, M1, M2, M3, M4, (the components and the first four metal interconnection levels M1, . . . , M4 being shown by a block in broken lines in FIGS. 3A-3D), each including at least one or more lines or strips or horizontal metal zones. Throughout this present description, "horizontal" means a direction lying in a plane parallel to the principal plane of a substrate (the principal plane of the substrate being defined as a plane passing through the substrate and parallel to the plane $[O; \vec{i}; \vec{j}]$ of an orthogonal mark $[O; \vec{i}; \vec{j}; \vec{k}]$ as represented in FIGS. 3A-3D and 4A-4B).

An insulating layer 104, based on $SiO_2$ or SiOC for example, and with a thickness of between 0.2 μm and 1 μm for example, such as of the order of 0.3 μm for example, is firstly formed on the 4th metal interconnection level M4. In the insulating layer 104, we can firstly form a plurality of interconnecting elements (not shown) or vias, intended to connect metal level M4 with a metal level that will be created later. In the insulating layer 104, we also form at least a cavity 105 intended to receive a horizontal part of the lower structure of the capacitor. The cavity 105 can be formed from a plurality of holes created in the insulating layer 104 and communicating with each other. In the cavity 105 there are etched insulating blocks created from the insulating layer 104. These insulating blocks can be in the form of separate insulating pads 106 with a predetermined spacing in the cavity 105 (FIG. 3A).

Next, we fill the cavity 105 using at least one metal material 107 such as copper, so as to form a metal strip 108, in which the insulating pads 106 are inserted. The horizontal metal strip 108 belongs to the fifth metal interconnection level M5. The insulating pads 106 inserted in the horizontal metal strip (108) limit the stresses generated by the metal material 107. A CMP polishing step (CMP for Chemical Mechanical Planarization), with stop on or in the insulating layer 104, can then be executed, so as to remove the metal material 107 from above the insulating layer 104 (FIGS. 3B and 4A representing the device in the process of creation, in a view from above and a cross section on A'A, respectively).

Next, from above, we create another insulating layer 109-114 formed, for example, from a thin sub-layer 109, diffusion barrier based on a dielectric material, such as $Si_3N_4$ or SiCN for example, covered with a second sub-layer of dielectric material 114, based on $SiO_2$ or SiOC for example. The insulating layer 109-114 can be designed to receive vertical interconnections or vias as well as vertical parts of the armatures of the three-dimensional capacitor.

Next, using at least one photolithography and etching step for example, we create slots 125 traversing the insulating layer 109-114 and opposite to the horizontal metal strip 108, belonging to metal level M5. The slots 125 can be positioned according to the spacing of the pads 106. In this example, the slots 125 are formed so as to expose the insulating pads 106 as well as metal zones 107 of the metal strip 108 around the insulating pads 106.

Next, we deposit a MIM stack 130-132-134 so as to cover the walls and the bottom of the slots 125. The MIM stack is created by deposition of a first thin metal layer 130 based on TiN or TaN for example, covering the walls and the bottom of the slots 125, with a thickness of the order of one or more nanometers for example. Next, a thin layer of dielectric material 132 based on $Al_2O_3$ or $HfO_2$ or $Ta_2O_5$, or $Si_3N_4$ for example, with a thickness of the order of one or more tens of nanometers for example, is deposited on the first thin metal layer 130. Next, a second thin metal layer 134, based on TiN or TaN for example, with a thickness of the order of one or more tens of nanometers for example, is deposited on the thin layer of dielectric material 132. In this example, at the bottom of the slots 125, the first thin metal layer 130 is in contact with the metal material 107 of the horizontal metal strip 108, and with the insulating pads 106 (FIG. 3C). The insulating pads 106 can have a critical dimension (measured in the $[O; \vec{i}; \vec{j}]$ plane of a orthogonal mark $[O; \vec{i}; \vec{j}; \vec{k}]$), of between 0.1 μm and 0.3 μm for example. For their part, the slots 125 can have a critical dimension (measured in the $[O; \vec{i}; \vec{j}]$ plane of a orthogonal mark $[O; \vec{i}; \vec{j}; \vec{k}]$) of between 0.2 μm and 0.4 μm for example. Throughout this present description, a critical dimension refers to the smallest dimension of a pattern created from one or more thin layers, other than the thickness of this layer or these thin layers.

Next, we fill the slots covered by the MIN stack 130-132-134, with at least one metal material 138, such as copper for example. After filling, we then remove layers 130, 132 and 134, as well as the metal material 138 in a zone located above the upper face of the insulating layer 109-114. This removal can be effected with a chemical-mechanical polishing (CMP) until we reach the upper face of the layer of dielectric material 114 (FIG. 3D).

Next, from above, we create another insulating layer 119-124 formed, for example, from a thin sub-layer 119, diffusion barrier, based on a dielectric material, such as $Si_3N_4$ or SiCN for example, covered with a second sub-layer of dielectric material 124, based on $SiO_2$ or SiOC for example. Vertical metal elements, commonly called vias (not shown), designed for interconnection of the fifth metal level M5 with a sixth metal level M6, can also be created in layer 109-114. We also form at least one other metal strip 148, based on copper for example, on the sixth metal interconnection level M6, above and opposite to metal strip 108. Metal strip 148 is intended to form a part of the upper horizontal armature of the MIM capacitor. To create this metal strip 148, at least one hole is created in the insulating layer 119-124, located opposite to metal strip 108, with filling of this hole with a metal material 147, such as copper for example.

We are then able to perform the deposition of another layer of dielectric material or materials, and then form, in this other layer of dielectric material or materials, a plurality of holes exposing the thick metal strip 148, and fill these holes with one or more metal materials in order to form vias 157 designed to create interconnections between the metal strip 148 of the sixth metal level and one or more contact pads.

A contact pad 168 can be created by deposition of a given metal material, for example, different from metal materials 107, 138, 147, and then photolithography and etching of the given metal material so as to create a plurality of contact pads, of which at least one contact stud 168 is opposite to metal strip 148. The given metal material is preferably a material that is resistant to oxidation phenomena, such as aluminium for example (FIGS. 4B and 3E, the device being shown in a view from above in FIG. 4B, and in cross section on D'D in FIG. 3E).

The microelectronic device created with the method described above is thus equipped with at least one capacitor with metal armatures that respectively include at least one "vertical" part, making a non-zero angle with the principal plane of the substrate, and orthogonal to the principal plane of the substrate 100 for example, and at least one horizontal part. The insulating pads 106 incorporated into the horizontal metal strip 108 forming a lower structure part of the capacitor, define a feature to reduce the stresses generated by the metal material 107 and limit or reduce or even prevent the formation of protuberances on the surface of the horizontal metal strip 108. This can allow the creation of a metal strip 108 of large area while still limiting the number of faults occurring within the integrated circuit. A capacitor with good performance in terms both of breakdown voltage and surface capacitance can thus be created.

Figure 5A:
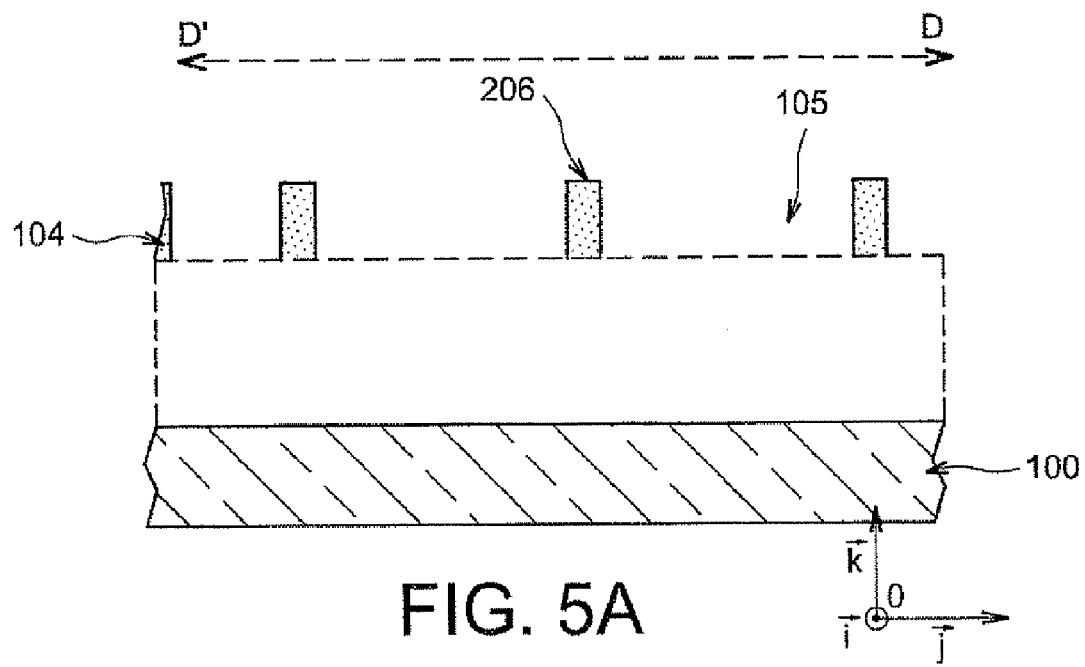
FIGS. 5A-5C, and 6 are cross-sectional and top views illustrating an example of a variant of an embodiment of a 3D MIM capacitor according to the present invention.
Figure 5B:
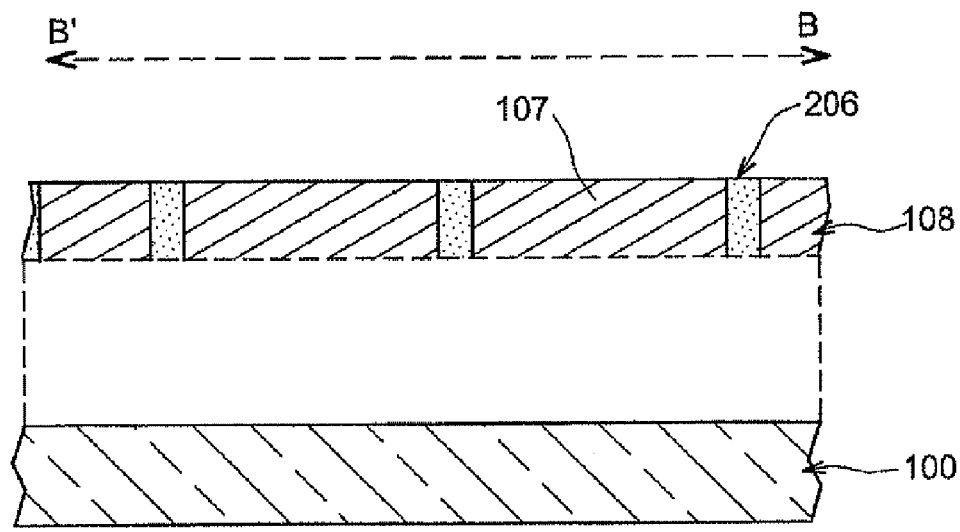
Figure 5C:
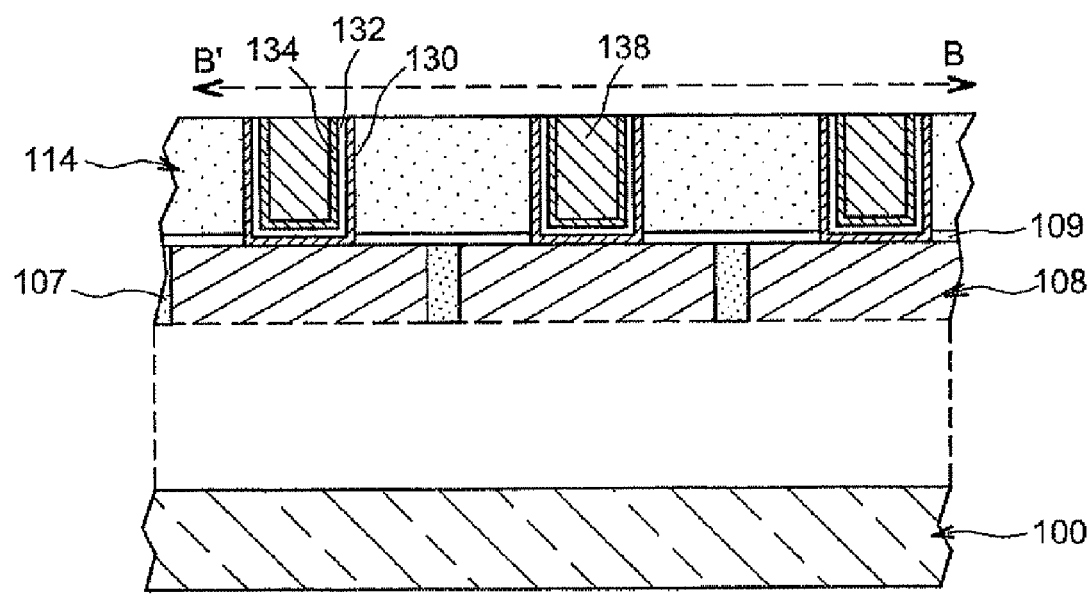
Figure 6:
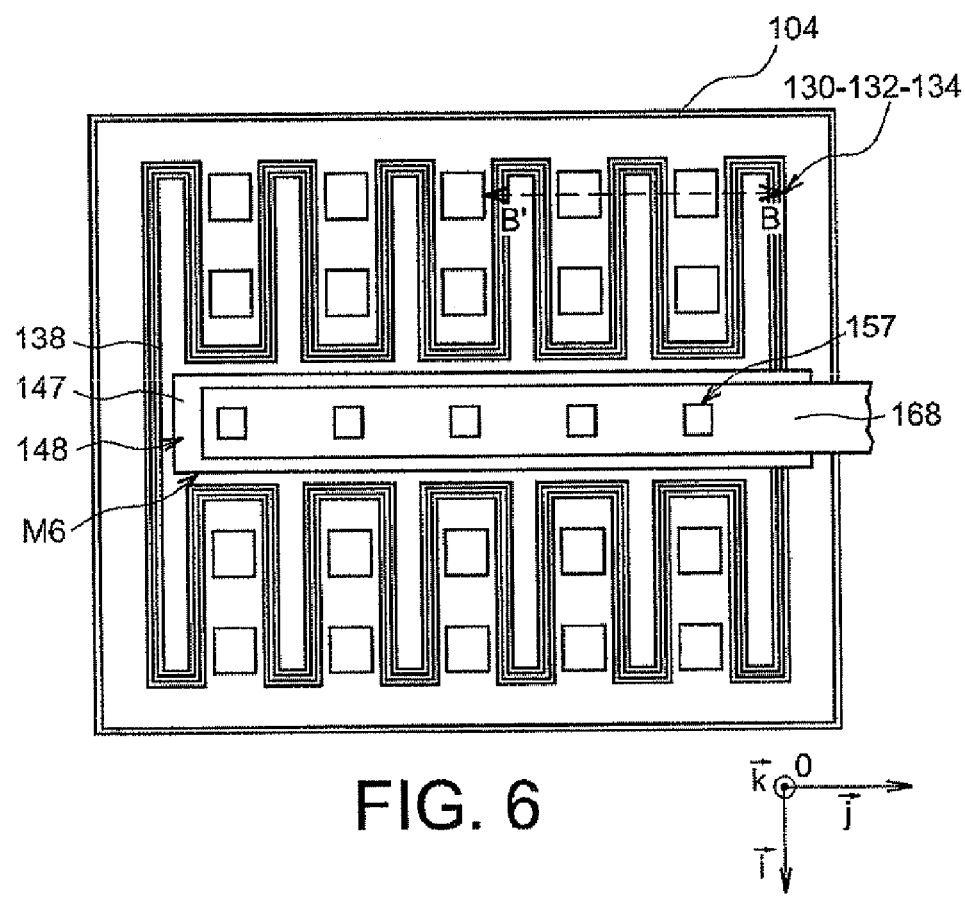

An alternative embodiment is given in connection with FIGS. 5A-5C and 6 (FIGS. 5A-5C firstly, and FIG. 6 secondly, representing the microelectronic device in the process of creation, in a cross section views on B'B, and in a view from above respectively). For this variant, the insulating pads incorporated into the metal strip 108 have a layout that is different from that described, in the above example, in relation to the filled slots of the MIM stack.

As for the example of embodiment described above in connection with FIG. 3A, we form firstly at least one cavity 105 intended to receive a horizontal part of the lower structure of the MIM capacitor. The cavity 105 can be formed from a plurality of holes in the insulating layer 104 communicating with each other and separated by the insulating pads 206 with etched zones created from insulating layer 104. The insulating pads 206 have a layout that is also designed according to that of the slots intended to be filled with the MIM stack and created later (FIG. 5A).

Next, we fill the cavity 105 based on at least one metal material 107, such as copper, so as to form metal strip 108. The insulating pads 206 incorporated into the horizontal metal strip 108 also limit the stresses generated by the deposition of metal material 107. A polishing step (CMP) then follows, stopping on insulating layer 104, so as to remove the metal material from above insulating layer 104 (FIG. 5B). Next, from above, we form insulating layer 109-114, and then, opposite to horizontal metal strip 108 belonging to metal level M5, slots are created traversing the insulating layer 109-114, which we fill with the MIM stack 130-132-134 and metal material 138. After filling, the chemical-mechanical polishing step can be executed as before.

In this example, the placement of the insulating pads 206 is arranged so that the latter are in contact with the insulating layer 109 and located between the filled slots of the stack 130-132-134 and the metal material 138. The insulating pads 206 are not located opposite to the slots filled by the MIM stack. The first thin metal layer 130 is in contact only with the metal material 107 of horizontal metal strip 108 (FIG. 5C).

Next, we can now create the same steps as for the example of embodiment described above, for creation of the sixth metal level M6, and in particular of horizontal metal strip 148, as well as contacts and in particular contact 168 (FIG. 6, the device being represented in a view from above, and the insulating layers located above insulating layer 104 not being shown in this figure).

Figure 7A:
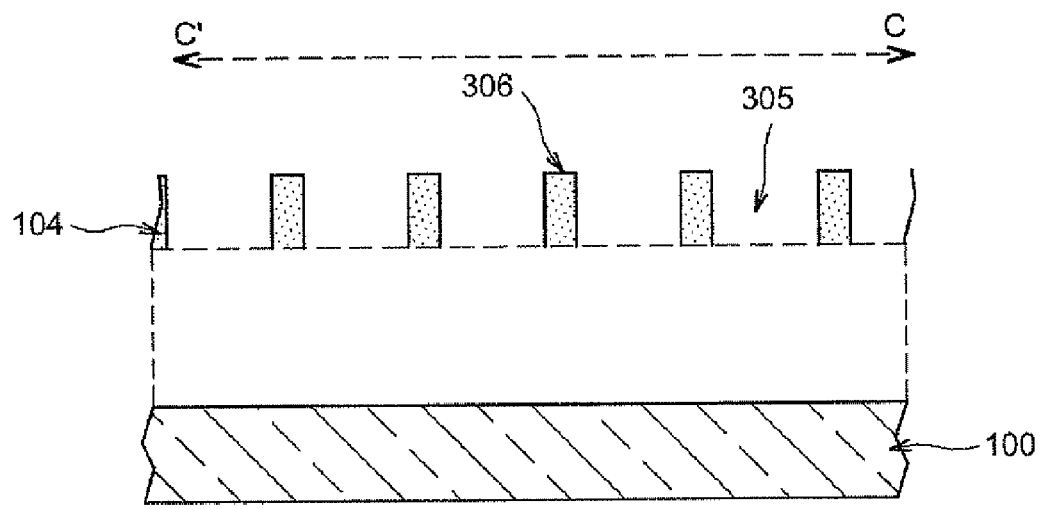
FIGS. 7A-7B, and 8A-8B are cross-sectional and top views illustrating another example of an embodiment of a 3D MIM capacitor according to the present invention.
Figure 7B:
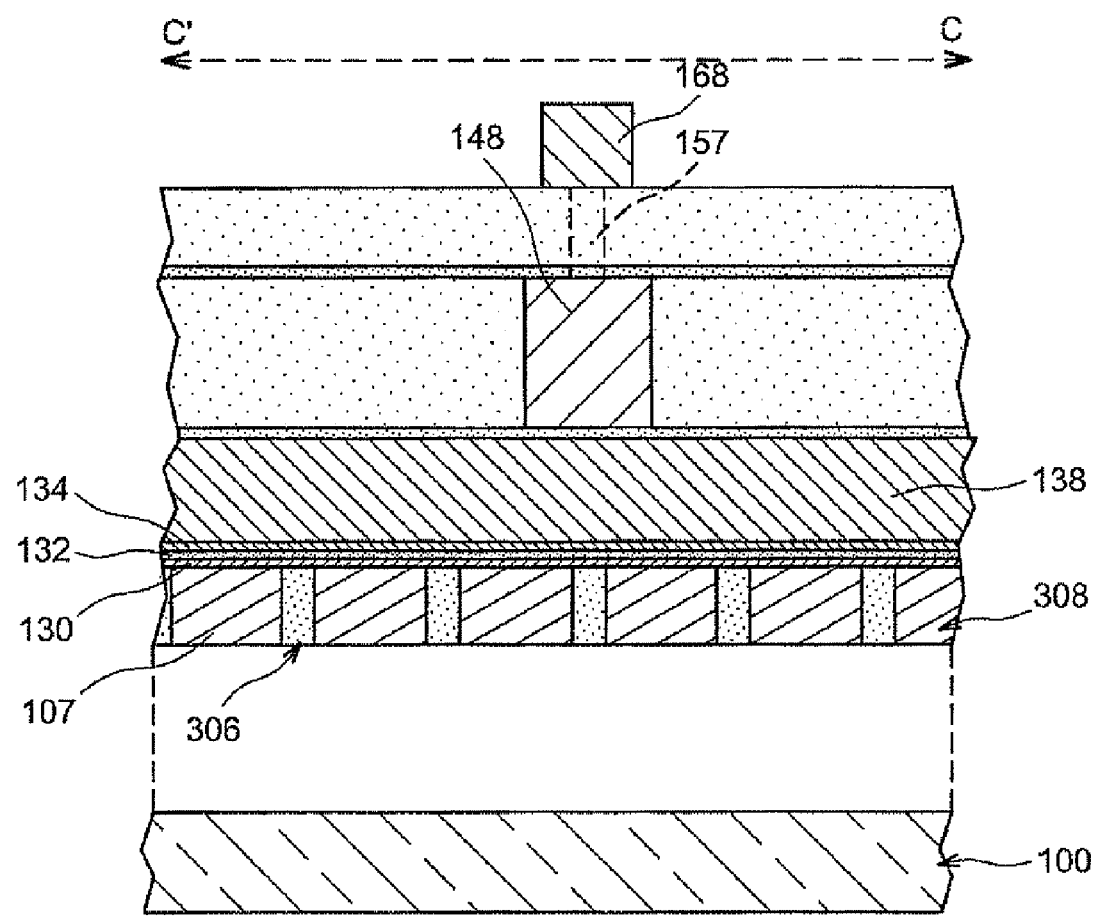
Figure 8A:
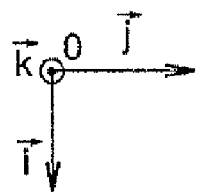
Figure 8A:
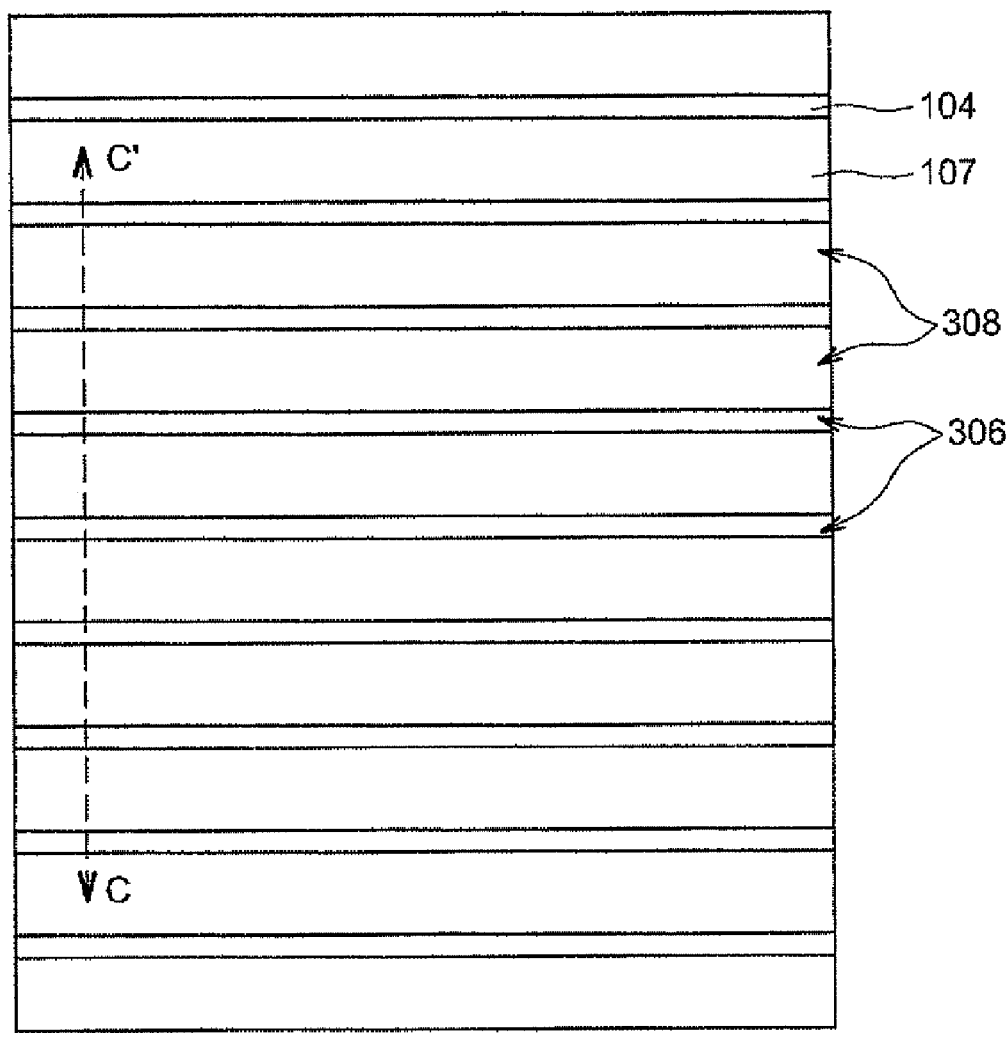
Figure 8B:
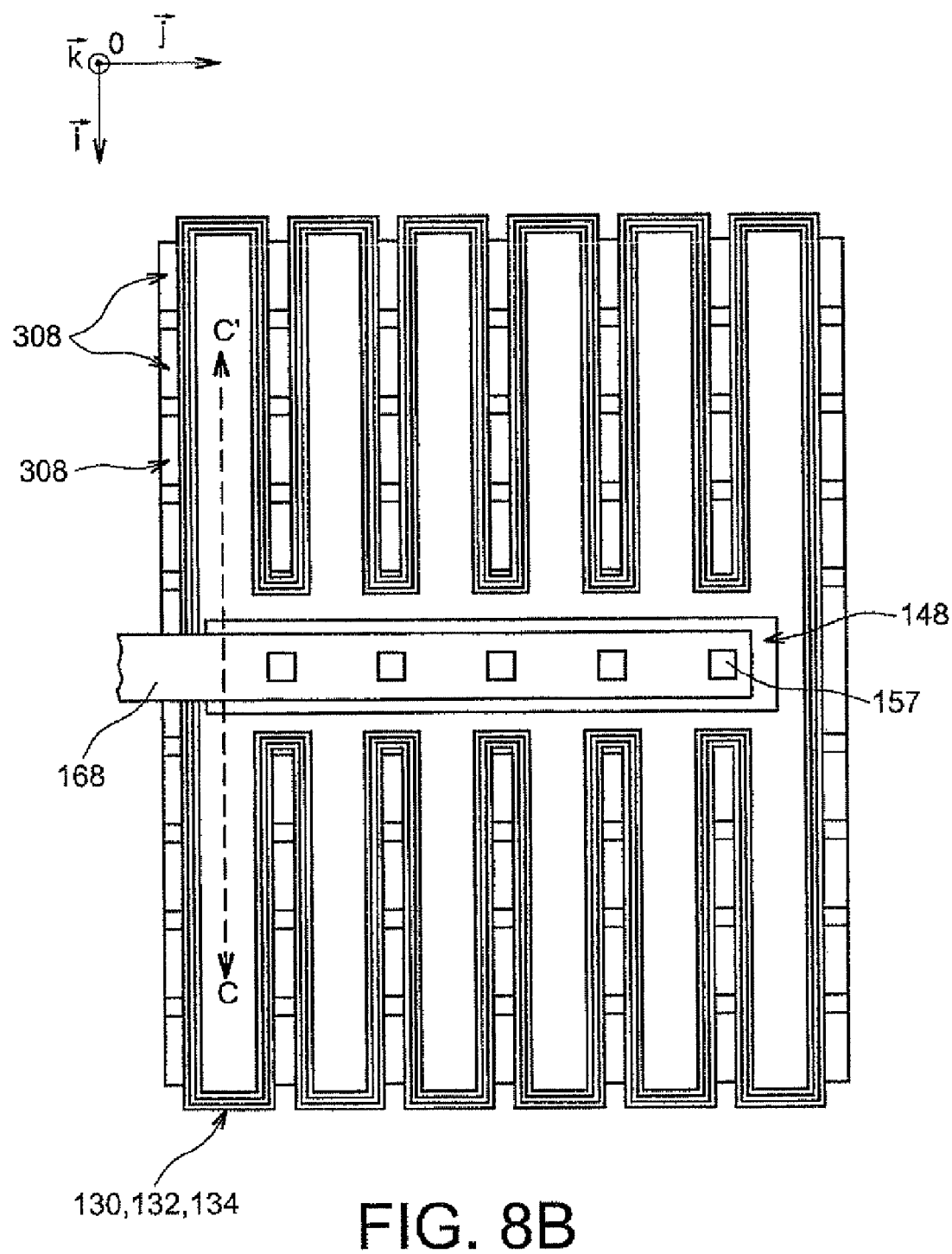

Another alternative embodiment is given in connection with FIGS. 7A-7B firstly and FIGS. 8A-8B secondly, representing the microelectronic device in the process of creation, in cross section on C'C and in a view from above respectively. The horizontal part of the lower structure of the MIM capacitor is also created in insulating layer 104. For this variant, with at least one photolithography and etching step for example, we form several parallel grooves 305. These grooves 305 can be set out with a regular pitch, and intended to receive a horizontal part of the lower structure of the MIM capacitor. Blocks created from etched insulating layer 104, in the form of parallel insulating strips 306, separate the grooves 305 from each other (FIG. 7A).

Next, we fill the grooves 305 with at least one metal material 107 such as copper, so as to form parallel metal strips 308, between which the insulating strips 306 are incorporated. The horizontal metal strips 308 belong to the fifth metal interconnection level M5 and are intended to form a horizontal metal portion of the lower structure of the capacitor, in which insulating strips 306 are incorporated. The insulating strips 306 limit the stresses generated by the metal material 107 used to fill the grooves. A polishing step (CMP) then follows, stopping on insulating layer 104, so as to remove the metal material 107 from above insulating layer 104 (FIG. 8A).

Next, on the fifth metal level, we create another insulating layer intended to receive vertical interconnections or vias, as well as vertical portions of armatures of the 3D capacitor. To create these vertical portions, using of at least one step of photolithography followed by etching for example, we create the slots 125 traversing the other insulating layer. As for the examples of previous methods, the slots 125 can form a pattern in the shape of a comb. Some of the slots are orthogonal to the metal strips 308. In this example, accurate positioning of the slots in relation to the metal strips 308 and to the insulating strips 306 is not necessary. Thus, a slight alignment offset during the step for creation of the slots, by photolithography for example, is not harmful.

When the slots have been created, we then execute the same steps as used during the examples of previous methods, in particular deposition of the MIN stack, then filling of the slots covered by the MIM stack 130-132-134 with at least one metal material 138 such as copper for example. After filling, a step of chemical-mechanical polishing can be carried out so as to remove the MIM stack and the metal material 138 from above insulating layer 109-114 (FIG. 8B).

Next, from above, we create another insulating layer 119-124 formed, for example, from a thin sub-layer 119, diffusion barrier, based on a dielectric material such as $Si_3N_4$, or SiCN for example, covered with a second sub-layer of dielectric material 124, based on $SiO_2$ or SiOC for example. Vertical metal elements commonly called vias (not shown), designed for interconnection of the fifth metal level with a sixth metal level, can be created in insulating layer 109-114. We also form the other metal strip 148 of the sixth metal interconnection level M6, above and opposite to metal strip 108. Next, we form the vias 157, and then the contact stud 168 (FIG. 8B).

The examples of methods that have been described above concern the creation of a 3D MIM capacitor. The invention is not limited to the production of three-dimensional capacitors however, and can be adapted, for example, for the formation of two-dimensional capacitors. In this case, according to one variant of the embodiment example given in connection with FIGS. 3A-3E, the creation of a MIM stack in the slots 125 can, for example, be replaced by deposition of an insulating layer so as to form the dielectric of the capacitor, and then deposition of metal so as to form the upper armature of the capacitor. As for the examples of methods described above, the lower structure of such a two-dimensional capacitor is created so as to include several built-in insulating blocks.

That which is claimed is:

1. A method of making a microelectronic device having at least one capacitor, the method comprising:
    forming, on a substrate, a plurality of components and a number k (where $k \geq 1$) of superimposed metal interconnection levels;
    forming a first insulating layer above the $k^{th}$ metal interconnection level and defining insulating blocks;
    forming, in the first insulating layer, a horizontal metal zone for a $k+1^{th}$ metal interconnection level, so that at least one insulating block is incorporated into the horizontal metal zone, the metal zone defining a lower structure part of the at least one capacitor;
    forming a second insulating layer above the $k+1^{th}$ metal interconnection level;
    forming, in the second insulating layer, a plurality of slots exposing portions of the horizontal metal zone; and
    covering side walls and a bottom of the slots with a metal-insulator-metal (MIM) stack including at least one first metal layer, at least one dielectric layer on the at least one first metal layer, and at least one second metal layer on the at least one dielectric layer.

2. The method according to claim 1, further comprising filling the slots with at least one metal material.

3. The method according to claim 1, wherein forming the metal zone includes:
    etching the first insulating layer to form at least one cavity with the insulating blocks being located therein; and
    filling the cavity with at least one metal material.

4. The method according to claim 3, wherein the slots also expose the insulating blocks.

5. The method according to claim 3, wherein the slots expose only the horizontal metal zone.

6. The method according to claim 1, wherein forming the horizontal metal zone includes:
    etching the first insulating layer to form a plurality of parallel grooves separated from each other by the insulating blocks; and
    filling the grooves with at least one metal material.

7. The method according to claim 6, wherein several of the plurality of slots are orthogonal to the grooves.

8. The method according to claim 1, further comprising forming a plurality of conducting elements in the second insulating layer, the conducting elements for connection between the $(k+1)^{th}$ metal interconnection level and a $(k+2)^{th}$ metal interconnection level.

9. The method according to claim 1, wherein the at least one capacitor comprises a three dimensional metal-insulator-metal (3D MIM) capacitor.

10. A microelectronic device comprising:
    a substrate and a number k (where $k \geq 1$) of superimposed metal interconnection levels thereon;
    a first insulating layer above a $k^{th}$ metal interconnection level and defining insulating blocks;
    at least one capacitor having a lower structure including at least one horizontal metal zone for a $k+1^{th}$ metal interconnection level and formed in the first insulating layer and including at least one insulating block therein;
    a second insulating layer located above the $k+1^{th}$ metal interconnection level, and including a plurality of slots exposing portions of the horizontal metal zone; and
    a metal-insulator-metal (MIM) stack on side walls and a bottom of the slots including at least one first metal layer, at least one dielectric layer on the first metal layer, and at least one second metal layer on the dielectric layer.

11. The device according to claim 10, further comprising a metal material filling the slots and in contact with the second metal layer.

12. The device according to claim 10, wherein the first metal layer of the MIN stack at the bottom of the slots is in contact only with the horizontal metal zone.

13. The device according to claim 10, wherein the insulating blocks are in contact with the first metal layer of the MIM stack at the bottom of the slots.

14. The device according to claim 10, wherein the horizontal metal zone includes separate parallel metal strips.

15. The device according to claim 14, wherein several of the plurality of slots are orthogonal to the metal strips.

16. The device according to claim 10, wherein the at least one capacitor comprises a three dimensional metal-insulator-metal (3D MIM) capacitor.

17. A microelectronic device comprising:
- a substrate and a plurality of superimposed metal interconnection levels thereon;
- a first insulating layer above one of the plurality of metal interconnection level and defining insulating blocks;
- at least one capacitor including at least one horizontal metal zone for another one of the plurality of metal interconnection levels and formed in the first insulating layer and including at least one insulating block therein;
- a second insulating layer located above the metal horizontal metal zone and including a plurality of slots therein; and
- a metal-insulator-metal (MIM) stack on side walls and a bottom of the slots.

18. The device according to claim 17, further comprising a metal material filling the slots and in contact with the MIM stack.

19. The device according to claim 17, wherein the MIM stack at the bottom of the slots is in contact only with the horizontal metal zone.

20. The device according to claim 17, wherein the insulating blocks are in contact with the MIM stack at the bottom of the slots.

* * * * *

UNITED STATES PATENT AND TRADEMARK OFFICE
CERTIFICATE OF CORRECTION

| | | |
|---|---|---|
| PATENT NO. | : 7,916,449 B2 | |
| APPLICATION NO. | : 12/134490 | |
| DATED | : March 29, 2011 | |
| INVENTOR(S) | : Cremer et al. | |

It is certified that error appears in the above-identified patent and that said Letters Patent is hereby corrected as shown below:

Column 1, Line 34      Delete: "nonzero"
Insert: --non-zero--

Column 2, Line 43      Delete: "an"
Insert: --a--

Column 2, Line 52      Delete: "tower"
Insert: --lower--

Column 2, Line 56      Delete: "capacitor"
Insert: --capacitors--

Column 5, Line 32      Delete: "MIN"
Insert: --MIM--

Column 6, Line 26      Delete: "views"
Insert: --view--

Column 7, Line 40      Delete: "MIN"
Insert: --MIM--

Column 7, Line 47      Delete: "diffusion"
Insert: --a diffusion--

Signed and Sealed this
Ninth Day of August, 2011

David J. Kappos
*Director of the United States Patent and Trademark Office*